United States Patent
Hachitani et al.

(10) Patent No.: US 10,132,896 B2
(45) Date of Patent: Nov. 20, 2018

(54) MAGNETIC RESONANCE MEASUREMENT APPARATUS WITH DYNAMIC VARIABLE ATTENUATOR

(71) Applicant: JEOL Ltd., Tokyo (JP)

(72) Inventors: Kenichi Hachitani, Tokyo (JP); Kenya Izumi, Tokyo (JP); Takeshi Tsukada, Tokyo (JP)

(73) Assignee: JEOL Ltd., Tokyo (JP)

( * ) Notice: Subject to any disclaimer, the term of this patent is extended or adjusted under 35 U.S.C. 154(b) by 790 days.

(21) Appl. No.: 14/805,680

(22) Filed: Jul. 22, 2015

(65) Prior Publication Data
US 2016/0187442 A1    Jun. 30, 2016

(30) Foreign Application Priority Data
Jul. 23, 2014    (JP) .................................. 2014-149862

(51) Int. Cl.
*G01R 33/54*    (2006.01)
*G01R 33/36*    (2006.01)

(52) U.S. Cl.
CPC ....... *G01R 33/543* (2013.01); *G01R 33/3607* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 5,172,394 A | 12/1992 | Kuster et al. | |
| 5,481,190 A * | 1/1996 | Sugiura | G01R 33/583 324/307 |
| 2002/0033697 A1* | 3/2002 | Sato | G01R 33/3628 324/318 |
| 2005/0094714 A1* | 5/2005 | Robinson | H04B 1/0483 375/148 |
| 2008/0234574 A1* | 9/2008 | Hancock | A61B 5/0507 600/430 |
| 2010/0225318 A1* | 9/2010 | Schmidt | G01R 33/56308 324/309 |
| 2011/0213274 A1* | 9/2011 | Telfort | A61B 7/003 600/586 |
| 2013/0119989 A1 | 5/2013 | Albrecht | |

FOREIGN PATENT DOCUMENTS

| | | |
|---|---|---|
| EP | 0523740 A1 | 1/1993 |
| JP | 523317 A | 2/1993 |
| JP | 8289880 A | 11/1996 |
| JP | 201249585 A | 3/2012 |

* cited by examiner

*Primary Examiner* — Tung X Nguyen
*Assistant Examiner* — Robert P Alejnikov, Jr.
(74) *Attorney, Agent, or Firm* — The Webb Law Firm (57) ABSTRACT

In a magnetic resonance measurement apparatus, a plurality of transmission signals are combined to generate a digital combined signal. The digital combined signal is converted into an analog combined signal by a D/A converter. The signal includes, for example, a first pulse of a rectangular shape and a second pulse of a mountain shape. During measurement, an operation of a dynamic variable attenuator is changed immediately after the first pulse. With this process, the second pulse is suppressed, and a suppressed second pulse is generated.

11 Claims, 8 Drawing Sheets

| 110 | 112 | 114 | 116 | 118 |
|---|---|---|---|---|
| RF | ORIGINAL SIGNAL/SAMPLING TARGET | TRANSMISSION SIDE ROUTE SELECTION | RECEPTION SIDE ROUTE SELECTION | SAMPLING SCHEME |
| GREATER THAN OR EQUAL TO 5 MHz AND LESS THAN 50 MHz (120) | RF SIGNAL (GREATER THAN OR EQUAL TO 5 MHz AND LESS THAN 50 MHz) | MIXER BYPASS | MIXER BYPASS | OVER-SAMPLING (100 MHz) |
| GREATER THAN OR EQUAL TO 50 MHz AND LESS THAN OR EQUAL TO 1000 MHz (122) | IF SIGNAL (125 MHz FOR OBSERVATION NUCLEUS) | MIXER PASS | MIXER PASS | UNDER-SAMPLING (100 MHz) |

MAGNETIC RESONANCE MEASUREMENT APPARATUS WITH DYNAMIC VARIABLE ATTENUATOR

CROSS REFERENCE TO RELATED APPLICATIONS

This application claims priority to Japanese Patent Application No. 2014-149862 filed on Jul. 23, 2014, which is incorporated herein by reference in its entirety.

BACKGROUND OF THE INVENTION

Field of the Invention

The present invention relates to a magnetic resonance measurement apparatus, and in particular to a suppression technique for a transmission signal.

Description of Related Art

As magnetic resonance measurement apparatuses, nuclear magnetic resonance (NMR) measurement apparatuses and electron spin resonance (ESR) measurement apparatuses are known. In addition, as apparatuses classified as NMR measurement apparatuses, magnetic resonance imaging (MRI) apparatuses are also known. In the following, NMR measurement apparatuses will be described.

NMR refers to a phenomenon where an atomic nucleus under a static magnetic field interacts with an electromagnetic wave having a frequency intrinsic to the atomic nucleus. An apparatus that executes measurement of a sample at an atomic level taking advantage of this phenomenon is an NMR measurement apparatus. Currently, NMR measurement apparatuses are used in analyses of organic compounds (for example, medicines and agricultural chemicals), polymer materials (for example, vinyl and polyethylene), biological substances (for example, nucleic acids and proteins), or the like. With the use of an NMR measurement apparatus, for example, a molecular structure of the sample can be revealed.

An NMR measurement apparatus generally includes a control computer, a radio frequency (RF) signal transmitter, an NMR signal detector (probe), a static magnetic field generator (superconductive magnet), an NMR signal receiver, and the like. In some cases, a part of these structures is called an NMR measurement apparatus. For example, a part of a spectrometer including the control computer, the RF signal transmitter, and the NMR signal receiver may be called an NMR measurement apparatus. In a typical NMR measurement, a high-frequency signal for NMR measurement (RF transmission signal) is generated in the transmitter, and the transmission signal is supplied to a transmission and reception coil in the probe. A resonance absorption phenomenon is caused in an observation nucleus in the sample due to an electromagnetic wave caused by the transmission signal. An NMR signal induced in the transmission and reception coil (RF reception signal) is then transmitted to the receiver, and a spectrum of the received signal is analyzed.

In the NMR measurement apparatus, in general, a plurality of signal generators which operate in parallel with each other are provided in order to realize measurement based on a complex pulse sequence. Each individual signal generator is constructed from, for example, a DDS (Direct Digital Synthesizer) or an NCO (Numerical Controlled Oscillator) (for example, refer to JP 2012-49585 A). Each individual signal generator has functions of an intensity (amplitude) modulation, a phase modulation, a frequency modulation, or the like, and generates a transmission signal (digital signal) having a designated frequency. Each of a plurality of transmission signals generated by the plurality of signal generators is converted into an analog signal and then the plurality of signals are combined. With this process, an analog combined signal is generated. The analog combined signal is amplified by a power amplifier, and is transmitted to the probe as an RF transmission signal.

Here, a scheme may be considered in which, after the plurality of transmission signals are combined as digital signals, the digital combined signal thus generated is converted into an analog combined signal. According to such a configuration, the number of D/A (digital-to-analog) converters may be reduced, and signal processor circuits or the like provided downstream of each D/A converter can be omitted. However, in this case, if a necessary amplitude ratio (amplitude ratio to be finally achieved) is given for the plurality of transmission signals from the start in the generation stage of the plurality of transmission signals, there is a problem in that, for example, as a result of a pulse having a low amplitude which gradually changes as an analog waveform being expressed in the digital waveform with a small number of bits, the waveform of the pulse cannot be expressed in a smooth manner, and the waveform becomes a step-shaped waveform. With such a transmission signal, a further problem may be caused in that an output resolution of the DAC (D/A converter) cannot be fully utilized. Such a problem also arises in other magnetic resonance measurement apparatuses.

In an MRI apparatus disclosed in JP H8-289880 A, a variable attenuator is provided downstream of a switching amplifier. However, because the structure employs a switching amplifier which is not a linear amplifier, the amplitude of the transmission signal which is uniformly and greatly amplified at the amplifier is merely modulated by the variable attenuator after the amplification. An idea of realizing a proper amplitude ratio between a plurality of transmission signals after the synthesis or a structure therefor is not disclosed in JP H8-289880 A described above. This is also true for an apparatus disclosed in JP H5-23317 A.

SUMMARY OF THE INVENTION

An advantage of the present invention is that adjustment of the amplitude ratio between a plurality of transmission signals after combine or synthesis of the signals in a magnetic resonance measurement apparatus is enabled. Another advantage of the present invention is that dynamic suppression for an analog transmission signal during the measurement can be realized. Yet another advantage of the present invention is that, during the dynamic suppression of the analog transmission signal, the influence of the frequency characteristic of the electronic circuits is minimized.

According to one aspect of the present invention, there is provided a magnetic resonance measurement apparatus comprising: a plurality of signal generators that generate a plurality of transmission signals as a plurality of digital signals; a combiner that combines the plurality of transmission signals to generate a digital combined signal; a digital-to-analog converter that converts the digital combined signal into an analog combined signal; a dynamic variable attenuator that suppresses the analog combined signal and in which a suppression level can be varied during measurement; and a controller that controls operations of the plurality of signal generators and the dynamic variable attenuator.

According to the above-described configuration, a plurality of transmission signals each generated as a digital signal are combined so that a digital combined signal is generated. The digital combined signal is converted into an analog combined signal by a D/A converter (DAC). The dynamic variable attenuator is a circuit that realizes an attenuation (amplitude suppression) action with respect to the analog combined signal. The controller dynamically controls the operation of the dynamic variable attenuator during measurement. With such a configuration, all or a part of the amplitude in the analog combined signal can be suppressed to generate a pulse train (transmission signal) having a desired amplitude. In other words, it becomes not necessary to give a final amplitude ratio between the plurality of transmission signals at the generation stage of the transmission signals. For example, even for a pulse that becomes low amplitude at the end, a pulse having a large amplitude may be generated. That is, according to the above-described configuration, it becomes unnecessary to give the final amplitude ratio in all cases during the generation of the plurality of transmission signals, and the final amplitude ratio (or an intermediate amplitude ratio) can be realized after the generation process using the dynamic variable attenuator. According to the above-described configuration, there can be obtained an advantage that the output resolution of the D/A converter can be effectively utilized.

The dynamic variable attenuation is preferably applied under a condition that there is no pulse overlap in the time axis between a plurality of transmission signals. However, even when there is a partial overlap between pulses, if the extent of the overlap is such that the problem caused by the dynamic variation of the suppression level can be ignored, the dynamic variable attenuation can be applied. In the case of a rectangular (quadrangular) pulse, even when the amplitude is small, the problem of the output resolution of the DAC as described above generally is not caused, and thus, for such a pulse, a necessary amplitude may be set in the stage of generating the transmission signal as the digital signal, in place of the suppression after the generation. Desirably, the amplitude adjustment at the pulse generation stage and the dynamic amplitude adjustment after the generation process by the dynamic variable attenuator are selected or combined, to generate the final pulse train.

According to another aspect of the present invention, preferably, the plurality of transmission signals include a first transmission signal and a second transmission signal, the analog combined signal includes a first pulse based on the first transmission signal and a second pulse based on the second transmission signal and existing after the first pulse, and the controller changes the operation of the dynamic variable attenuator in units of pulses. When the suppression level is switched in units of pulses, it is possible to prevent unnecessary deformation of the pulse shape. However, if such a problem does not occur or the influence thereof can be ignored, the dynamic variation of the suppression level may be applied within one pulse period.

According to another aspect of the present invention, preferably, the first transmission signal includes a first original pulse which is an origin of the first pulse, the second transmission signal includes a second original pulse which is an origin of the second pulse, and the controller controls the operations of the plurality of signal generators such that a ratio between an amplitude of the first original pulse and an amplitude of the second original pulse is closer to 1 than is a ratio between an amplitude of the first pulse and an amplitude of the second pulse. This configuration does not realize the final amplitude ratio from the start, and gives a tentative amplitude ratio close to 1 at the signal generation stage.

According to another aspect of the present invention, preferably, the controller changes the operation of the dynamic variable attenuator between the first pulse and the second pulse when the first pulse which is a rectangular pulse and the second pulse which is a non-rectangular pulse are consecutive on a time axis. According to such a configuration, the shape of the rectangular pulse can be maintained. Even when the non-rectangular pulse is affected due to delay in the response, the influence is generally small if the non-rectangular pulse is, for example, a mountain-shaped pulse.

According to another aspect of the present invention, preferably, the controller changes the operation of the dynamic variable attenuator between the first pulse and the second pulse when the first pulse which is a non-rectangular pulse and the second pulse which is a rectangular pulse are consecutive on a time axis. In this configuration, when the shape of the rectangular pulse is to be maintained, the operation of the dynamic variable attenuator is preferably changed at a suitable timing before the rectangular pulse in anticipation of the delay in the response of the dynamic variable attenuator. When the non-rectangular pulse is, for example, a mountain-shaped pulse, even if an unnecessary attenuation action is applied thereto, the action generally can be ignored.

According to another aspect of the present invention, preferably, the controller is formed by one or a plurality of sequencers that execute a sequence of instructions generated from a pulse program, and the sequence of instructions includes instructions to change the operation of the dynamic variable attenuator. According to another aspect of the present invention, preferably, the magnetic resonance measurement apparatus further comprises a power amplifier provided downstream of the dynamic variable attenuator. According to such a configuration, an attenuator having low voltage endurance may be used as the dynamic variable attenuator.

According to another aspect of the present invention, preferably, the magnetic resonance measurement apparatus further comprises a mixer provided between the dynamic variable attenuator and the power amplifier, and that executes a frequency conversion. Generally, all circuits have a certain frequency characteristic, which may be small or large, and the dynamic variable attenuator circuit is no exception. In a structure in which an IF (intermediate frequency) signal is converted into an RF signal by the mixer, a frequency range of the intermediate frequency is relatively narrow (or the intermediate frequency is fixed), but a frequency range of the RF signal after the conversion is very wide. Therefore, when the dynamic variable attenuator is provided downstream of the mixer, the frequency characteristic of the circuit itself cannot be ignored. For example, correction of a phase change (phase shift) caused in the circuit is difficult. On the other hand, according to the above-described configuration, such a problem can be avoided or reduced.

DESCRIPTION OF THE INVENTION

A preferred embodiment of the present invention will now be described with reference to the drawings.

(1) NMR Measurement Apparatus

Figure 1:
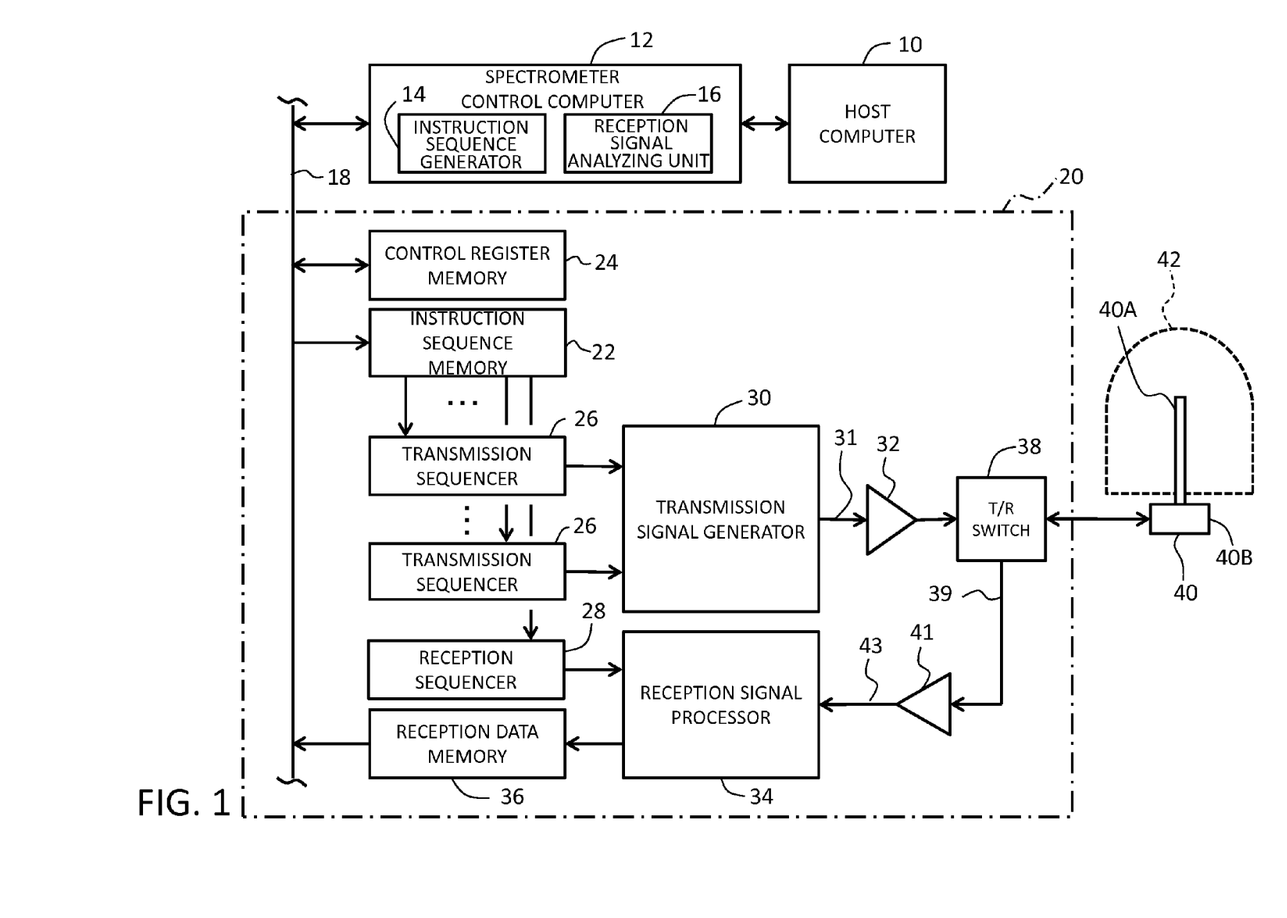
FIG. 1 is a block diagram showing an NMR measurement apparatus according to a preferred embodiment of the present invention.

FIG. 1 shows a preferred embodiment of an NMR measurement apparatus according to the present invention. The NMR measurement apparatus is used for analysis of organic compounds, polymer materials, biological substances, and other substances. A sample to be measured is liquid, solid, or the like. The present invention also can be applied to other magnetic resonance measurement apparatuses.

In FIG. 1, a host computer 10 generates a pulse program. The pulse program is a program describing a pulse sequence for realizing a desired NMR measurement, and is generated by a user or automatically. The pulse program is sent from the host computer 10 to a spectrometer control computer 12. The host computer 10 may be formed by a typical personal computer.

The spectrometer control computer 12 controls an operation of a transmission and reception unit 20 which will be described in detail later, and analyzes reception data obtained from the transmission and reception unit 20. The spectrometer control computer 12 and the transmission and reception unit 20 form a spectrometer. In the present embodiment, the spectrometer control computer 12 is equipped with an instruction sequence generator 14 that converts the pulse program into a sequence of instructions (instruction sequence). The instruction sequence generator 14 is formed, for example, as a compiler. In the present embodiment, the instruction sequence generator 14 generates a sequence of instructions for controlling the transmission and reception unit 20, and the sequence of instructions is sent to the transmission and reception unit 20. Alternatively, the pulse program may be sent to the transmission and reception unit 20 and the transmission and reception unit 20 may interpret the pulse program to generate the instruction sequence. Alternatively, the spectrometer control computer 12 may generate a compressed, intermediate instruction sequence and transfer the instruction sequence to the transmission and reception unit 20, and the transmission and reception unit 20 may decompress the intermediate instruction sequence, to re-construct an uncompressed instruction sequence. In particular, when a transfer rate (amount of data) during transfer is problematic, the transfer of the compressed intermediate instruction sequence as described above is desirable.

The spectrometer control computer 12 is connected to the transmission and reception unit 20 via a communication bus 18. In the example configuration shown in the drawings, the spectrometer control computer 12 is connected to the host computer 10 via a network. The spectrometer control computer 12 is formed, for example, by a dedicated or general-purpose computer. In the present embodiment, the spectrometer control computer 12 is equipped with an FFT calculation function for analyzing the spectrum of the reception signal. This function is shown in FIG. 1 as a reception signal analyzing unit 16. The spectrometer control computer 12 is equipped with, in addition to the spectrum analyzing function, a control function, and an administrative function necessary for the NMR measurement. Alternatively, the host computer 10 and the spectrometer control computer 12 may be integrated. Alternatively, a plurality of the spectrometer control computers 12 may be employed. Further alternatively, a part or all of the functions of the spectrometer control computer 12 described above may be equipped in the host computer 10.

The transmission and reception unit 20 will now be described. The transmission and reception unit 20 generates a transmission signal which is necessary for the NMR measurement, and processes a reception signal which represents a result of the NMR measurement. Alternatively, the transmission and reception unit 20, or a part in which the transmission and reception unit 20 and the spectrometer control computer 12 are combined (spectrometer), may be called the NMR measurement apparatus.

An instruction sequence memory 22 stores, in the present embodiment, the sequence of instructions sent from the spectrometer control computer 12. For example, when the sequence of instructions is converted to the intermediate instruction sequence described above, a calculation processor (not shown) generates (re-constructs) the final instruction sequence from the intermediate instruction sequence. Alternatively, the sequence of instructions may be generated by another circuit. On the instruction sequence memory 22, a plurality of storage areas which store the sequence of instructions in units of sequencers to be described below are provided. Alternatively, the storage areas may be provided inside each sequencer. The sequence of instructions includes various instructions, including a dynamic setting parameter to be given to individual dynamic circuit (for example, a suppression level which is set for the dynamic variable attenuator to be described later).

In the present embodiment, in addition to the instruction sequence memory 22, a control register memory 24 is provided. On the control register memory 24, a register area is set, and a static setting parameter to be given to an individual static circuit is written in the register area. Similar to the sequence of instructions, the setting parameter is generated based on the pulse program. The writing of the static setting parameter to the register area is executed by the spectrometer control computer 12. For example, a controller (not shown) may read each static setting parameter from the register area and set the same in each static circuit. Alternatively, an individual static circuit may acquire the static setting parameter from the register area on its own.

In the present disclosure, "static" generally means that an operation condition of the circuit (static circuit) is determined before start of execution of the measurement, and "dynamic" generally means that the operation condition of the circuit (dynamic circuit) is determined during the measurement (that is, the operation condition is changed). In other words, for the static circuit, a necessary setting parameter is given before the start of the measurement, and the setting parameter is maintained during the measurement. For the dynamic circuit, a control is applied to update the setting parameter at a necessary timing during the measurement. With such a configuration, the operation condition of the dynamic circuit is dynamically varied.

A plurality of transmission sequencers 26 control the operations of the plurality of transmission signal generators or the like of a transmission signal generator (transmitter) 30. More specifically, each individual transmission sequencer 26 sequentially executes the sequence of instructions prepared for the transmission sequencer 26 from the beginning. In the present embodiment, four transmission signal generators (four signal generators (FIG. 2)) are provided, and, correspondingly, four transmission sequencers 26 are provided. Specifically, a first transmission sequencer controls a first signal generator, a second transmission sequencer controls a second signal generator, a third transmission sequencer controls a third signal generator, and a fourth transmission sequencer controls a fourth signal generator. However, the one-to-one correspondence relationship is not a requirement, and alternatively, one transmission sequencer may control a plurality of signal generators or a plurality of transmission sequencers may control one signal generator. The control of the operations of a circuit that combines the plurality of the transmission signals (a combiner shown in FIG. 2 and described later) and operations of circuits provided downstream thereof (circuits downstream of the combiner shown in FIG. 2 and described later) is executed by a part or all of the four transmission sequencers. So long as each dynamic circuit can execute a suitable operation at a suitable timing according to the sequence of instructions generated from the pulse program, various structures may be employed for the sequencer or the local controller. The numerical values explicitly described in the present disclosure are given only as exemplary values.

A reception sequencer 28 basically has the same structure as an individual transmission sequencer 26, and sequentially executes the sequence of instructions prepared for the reception sequencer 28 from the beginning. With such a configuration, the operation of each dynamic circuit of a reception signal processor (receiver) 34 is controlled. According to the present embodiment, the reception circuit can also be controlled dynamically. For example, as will be described later, a frequency modulation and a phase modulation can be applied to a pair of reference signals used in quadrature detection, and, moreover, the modulation conditions can be dynamically changed during the measurement. In the present embodiment, only a single reception sequencer 28 is exemplified, but alternatively, the reception signal processor 34 may be controlled by a plurality of reception sequencers. Alternatively, a sequencer which integrally manages the control timings or the like of one or more transmission sequencers and one or more reception sequencers may be provided separately.

The transmission signal generator 30 includes a plurality of signal generators serving as the plurality of transmission signal generators, an adder serving as the combiner, a D/A converter (DAC), a signal processor circuit, a frequency converter circuit, or the like. A specific example structure thereof will be described later with reference to FIG. 2. The transmission signal generator 30 generates an RF transmission signal 31 for NMR measurement. The RF transmission signal 31 is an analog signal, and is transmitted to a power amplifier 32 that executes amplification. The RF transmission signal amplified by the power amplifier 32 is transmitted to a probe 40 via a T/R switch (transmission and reception switch) 38.

The probe 40 includes an insertion section 40A having a transmission and reception coil (not shown), and a housing section 40B corresponding to a root portion of the insertion section 40A. In the example configuration shown in the drawings, the probe has one port, and thus one RF transmission signal is input to the probe. Alternatively, a probe having two or more ports may be used. The insertion section 40A has a cylindrical shape, and is inserted into a bore (cylindrical cavity) of a static magnetic field generator 42. When the RF transmission signal is supplied to the transmission and reception coil, an electromagnetic wave generated in the coil is irradiated onto the sample, and a resonance absorption phenomenon occurs at the observation nucleus of the sample. Then, the NMR signal induced in the transmission and reception coil (RF reception signal) is transmitted from the probe 40 to the reception signal processor 34 via the T/R switch 38.

In the present embodiment, the T/R switch 38 has a routing function to transmit the RF transmission signal to the probe during the transmission and to transmit the RF reception signal from the probe to the reception signal processor 34 during reception. A reception signal 39 from the T/R switch 38 is amplified by a pre-amplifier 41, and an amplified reception signal 43 is transmitted to the reception signal processor 34. Alternatively, the pre-amplifier 41 may be built in the T/R switch 38.

The reception signal processor 34 in the transmission and reception unit 20 is a circuit which executes processes such as the frequency conversion, the A/D (analog-to-digital) conversion, the quadrature detection, or the like on the input RF reception signal. A specific example structure will be described later with reference to FIG. 3. The processed reception signal (complex signal) is temporarily stored in reception data memory 36 as reception data. The reception data which is read from the reception data memory 36 is transmitted to the spectrometer control computer 12, and the analysis of the reception data is executed therein. Alternatively, the reception data may be analyzed in the transmission and reception unit 20.

(2) Transmission Signal Generator

Figure 2:
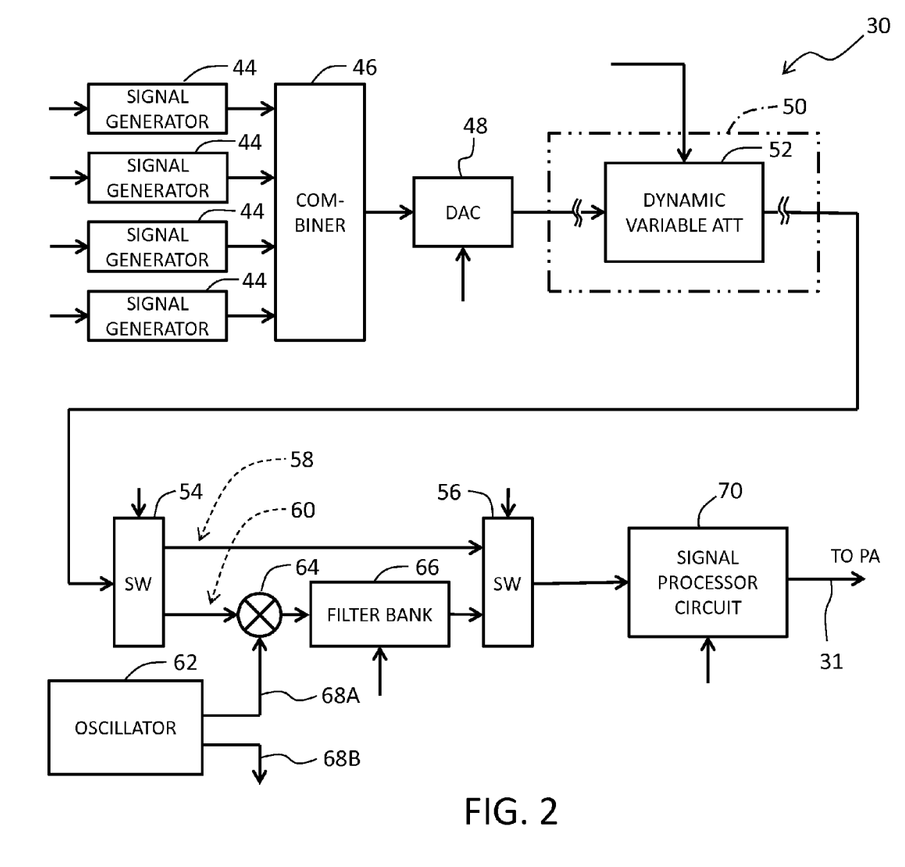
FIG. 2 is a block diagram showing an example structure of a transmission signal generator.

Next, a specific example structure of the transmission signal generator 30 will be described with reference to FIG. 2. In FIG. 2, four signal generators 44 generate a maximum of four transmission signals. The operations of four signal generators 44 are basically controlled by four transmission sequencers. Specifically, a parameter set which defines the operation of each signal generator 44 is provided from each transmission sequencer to each signal generator 44. In the present embodiment, each signal generator 44 includes an NCO (Numerical Controlled Oscillator). The NCO includes a phase accumulator, a sine wave lookup table, or the like. Using the NCO, the frequency modulation, the phase modulation, and the amplitude modulation can be executed. In other words, in each signal generator 44, a transmission signal (original signal) to which the modulation process or the like is applied is generated independently from each other. The frequency of the signal generated in the NCO can be freely determined.

In the present embodiment, the frequency of the transmission signal generated by the signal generator 44 can be arbitrarily selected from, for example, a range of 5-200 MHz. As will be described below, when the frequency of the observation nucleus (frequency of the RF signal) falls within a low frequency band of, for example, greater than or equal to 5 MHz and less than 50 MHz, the frequency of the generated transmission signal (original frequency) is set as the frequency of the RF transmission signal. On the other hand, when the frequency of the observation nucleus falls within a high frequency band of, for example, greater than or equal to 50 MHz and less than or equal to 1000 MHz, a frequency of 125 MHz, for example, is selected as the frequency of the generated transmission signal (original frequency), and is set as an intermediate frequency. The final RF transmission signal is then generated by a frequency conversion with respect to the intermediate frequency signal.

A combiner 46 is a circuit which combines (for example, adds) the plurality of transmission signals (digital signals) generated by the plurality of signal generators 44, to generate a digital combined signal. There is a case where, in reality, only one transmission signal is generated in a group of signal generators, but in many cases, a plurality of transmission signals are generated. For the purpose of this disclosure, an output signal of the combiner 46 will be described as a digital combined signal. The digital combined signal is transmitted to a DAC (D/A converter) 48. A sampling clock of, for example, 800 MHz, is input to the DAC 48, and the digital combined signal is converted into an analog combined signal in the DAC 48. A filter, an amplifier, and other circuits provided downstream of the DAC 48 are omitted in the drawings.

A signal processor circuit 50 is provided downstream of the DAC 48, and includes a dynamic variable ATT (attenuator) 52. The dynamic variable ATT 52 is dynamically controlled by any of the sequencers during the measurement. Specifically, by the action of the dynamic variable ATT 52, the suppression level for the pulse train can be dynamically varied during the measurement. For example, when the analog combined signal which is input to the dynamic variable ATT 52 includes a rectangular pulse of a large amplitude (hard pulse) and a subsequent mountain-shaped pulse of a large amplitude (soft pulse), if the suppression level is set large immediately after the preceding rectangular pulse; for example, if the suppression level is changed from 0 dB to −60 dB, the overall amplitude of the succeeding mountain-shaped pulse can be suppressed while maintaining the amplitude and the waveform of the preceding rectangular pulse. With such a configuration, for example, a pulse sequence as designed, in which a difference in level (difference in amplitude intensity) is provided between the rectangular pulse and the shaped pulse can be realized afterwards. The step of the suppression level of the dynamic variable ATT 52 is, for example, 1 dB.

The dynamic variable ATT 52 is made of, for example, a plurality of ATT elements, and one or more ATT elements are selected from the plurality of ATT elements or a combination thereof is selected, to realize a desired suppression level. While it is desirable to employ a structure that can realize suppression levels of multiple stages, it is also possible to use a dynamic variable ATT having suppression levels of two stages. Alternatively, an apparatus in which the suppression level can be continuously varied may be used as the dynamic variable ATT. In either case, it is desirable to employ an apparatus having a superior responsiveness. In this process, the supply timing of the control signal to the dynamic variable ATT 52 may be adjusted in anticipation of the delay of the response.

In the present embodiment, the suppression level at the dynamic variable ATT 52 can be dynamically varied in units of individual pulse forming the analog combined signal, for example, in units of the transmission signals from the signal generators 44. Alternatively, a configuration may be employed in which the suppression level can be stepwise or continuously varied within one pulse period included in the analog combined signal. Alternatively, the dynamic variation of the suppression level may be applied to the pulse train which is output from one signal generator 44.

In the present embodiment, the dynamic variable ATT 52 is provided upstream of a frequency converter circuit to be described later (in particular, a mixer 64). With such a configuration, compared to a structure where the dynamic variable ATT 52 is provided downstream of the frequency converter circuit, the influence due to the frequency characteristic of the dynamic variable ATT 52 (in particular, phase shift) can be inhibited. Specifically, at the downstream of the frequency converter circuit, a variation range of the frequency of the RF transmission signal is very wide (in the present embodiment, greater than or equal to 50 MHz and less than or equal to 1000 MHz), and, if the dynamic variable ATT is provided there, the influence by the frequency characteristic of the dynamic variable ATT cannot be ignored, and the phase shift would be great or the phase would change in a complex manner during the dynamic change of the suppression level, for which correction is very difficult. On the other hand, when the dynamic variable ATT is provided upstream of the frequency converter circuit, the frequency of the IF signal passing therethrough is fixed (in the present embodiment, 125 MHz) or the frequency change width of the RF signal passing therethrough is relatively small (in the present embodiment, greater than or equal to 5 MHz and less than 50 MHz), and, consequently, even if there is an influence due to the frequency characteristic as described above, the influence would be relatively small and can be easily corrected.

A frequency converter circuit with a bypass route is provided downstream of the signal processor circuit 50. The frequency converter circuit specifically includes an input side SW (switch) 54, an output side SW 56, and a frequency conversion route 60 and a bypass route 58 provided between the SWs, or the like. On the frequency conversion route 60, the mixer 64 and a filter bank 66 are provided. In the mixer 64, a local signal 68A from an oscillator 62 is mixed into the analog combined signal which is input (in this case, an intermediate frequency signal), and an RF transmission signal is thus generated. In reality, an unnecessary frequency component caused in the mixing (for example, a mixer image corresponding to a sum frequency or a difference frequency) is removed by the filter bank 66, and the RF transmission signal is thus generated. The filter bank 66 includes, for example, a plurality of LPFs (low pass filters) or HPFs (high pass filters) that are provided in parallel to each other, and the LPF or HPF to be actually used is selected therefrom. A cutoff frequency of the filter is statically changed according to the RF frequency. Alternatively, in place of the LPF or the HPF, other filters such as a BPF (band pass filter) may be provided.

In the present embodiment, when the frequency of the observation nucleus falls within the low frequency band, a direct generation scheme; that is, a non-conversion scheme is selected, and, in this case, the input side SW 54 and the output side SW 56 select the bypass route 58. In other words, in this case, the mixer 64 and the filter bank 66 do not function. In this case, the analog combined signal which is the input signal of the frequency converter circuit is not the intermediate frequency signal, and is the RF transmission signal. That is, when the direct generation scheme is selected, the RF transmission signal is generated from the beginning at the plurality of signal generators 44.

On the other hand, when the frequency of the observation nucleus falls within the high frequency band, a frequency conversion scheme is selected, and in this case, the input side SW 54 and the output side SW 56 select the frequency conversion route 60. In other words, in this case, the mixer 64 and the filter bank 66 function. In this case, the analog combined signal, which is the input signal of the frequency converter circuit serves as the intermediate frequency signal, is mixed with the local signal 68A in the mixer 64, then passes through the filter bank 66, and becomes the RF transmission signal. In the above-described example configuration, the ranges for the low frequency band and the high frequency band can be suitably determined. The input side SW 54 and the output side SW 56 are static circuits, and the operations thereof are set before the start of the measurement. Alternatively, the SWs may be constructed as dynamic circuits, and the scheme may be switched during the measurement.

The oscillator 62 is a signal generator which generates the local signal 68A to be supplied to the mixer 64. A frequency of the local signal 68A is determined as a frequency necessary for the frequency conversion from the IF to the RF. The local signal generated in the oscillator 62 is also transmitted to the reception signal processor. This signal is shown with reference numeral 68B. By using the same signal, a transmission processing condition and a reception processing condition can be matched. In this case, it is desirable to match the signal route lengths.

A signal processor circuit 70 is a circuit provided downstream of the frequency converter circuit. The signal processor circuit 70 includes a static fixed ATT and a static variable ATT which can be operated as necessary. An attenuation value of the static fixed ATT is fixed. The attenuation value of the static variable ATT can be varied and set in intervals of predetermined units. The ATTs are static circuits, and the presence/absence of the operation (and the operation condition of the static ATT) is set prior to the start of the measurement. Because the static fixed ATT and the static variable ATT are circuits that are statically set, the phase shift or the like can be identified in advance. In addition, the phase shift or the like can be corrected in advance or afterwards. In the present embodiment, because the static fixed ATT and the static variable ATT are provided downstream of the frequency converter circuit; that is, at the final stage of the transmission signal generator, advantages can be obtained that, due to the suppression actions of the ATTs, the transmission signal which follows the pulse sequence can be generated and that the unnecessary signal generated in the generation process of the transmission signal or mixed noise can be suppressed.

The RF transmission signal 31 is generated by the transmission signal generator 30 in a manner as described above. The RF transmission signal 31 is amplified by the power amplifier 32 shown in FIG. 1, and the amplified RF transmission signal is output to the probe 42 via the T/R switch 38.

(3) Reception Signal Processor

Figure 3:
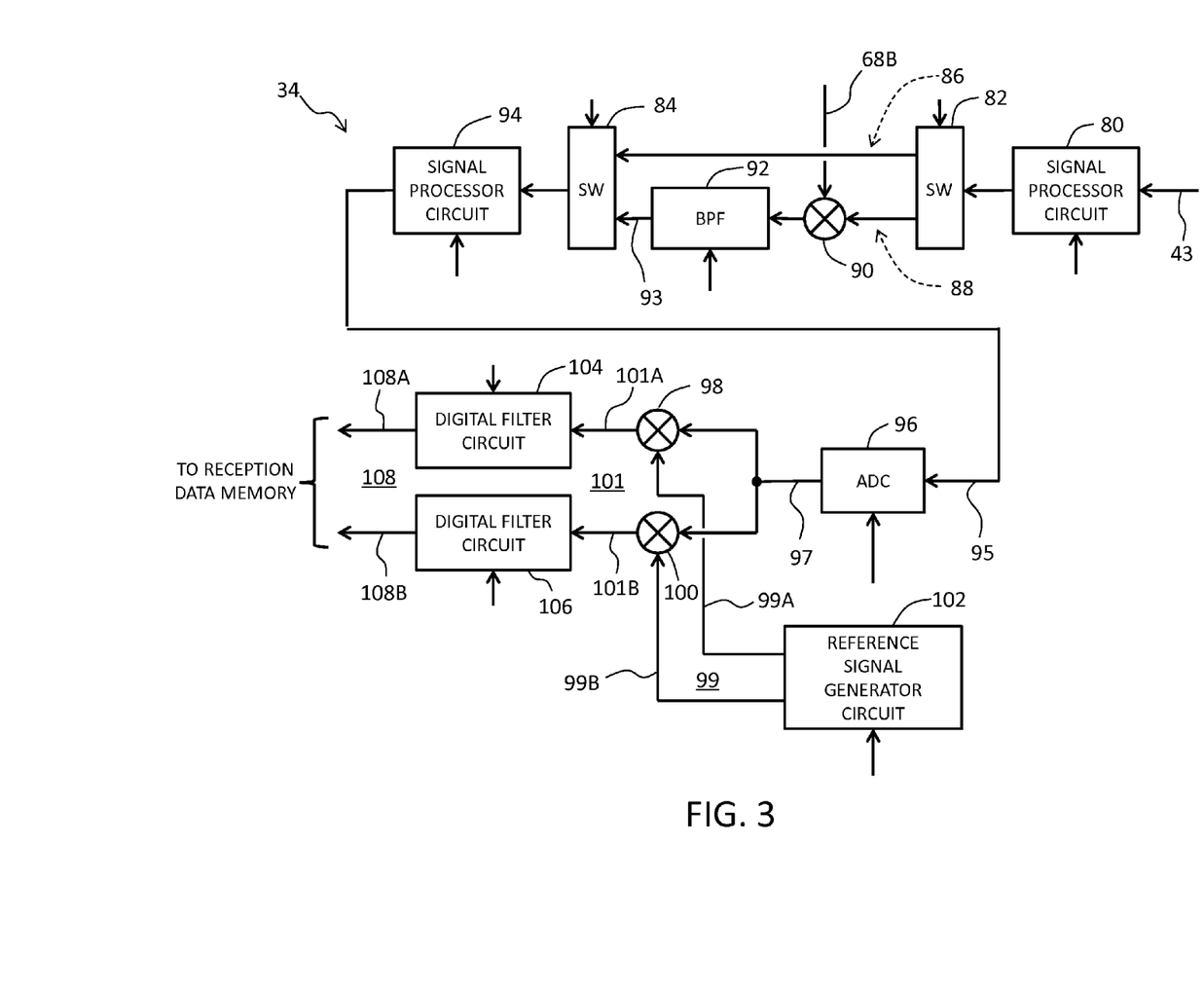
FIG. 3 is a block diagram showing an example structure of a reception signal processor.

Next, a specific example structure of the reception signal processor 34 will be described with reference to FIG. 3. The RF reception signal 43 amplified by the pre-amplifier 41 (FIG. 1) passes through a signal processor circuit 80 and is input to a frequency converter circuit with a bypass route. The signal processor circuit 80 has a fixed amplifier, a variable amplifier, a variable ATT, or the like. These circuits are static circuits. With the signal processor circuit 80, because the NMR signal can be amplified upstream of the frequency converter circuit; that is, at the first stage of the reception signal processor, advantages can be obtained in that the unnecessary signal generated in the reception process or the mixed noise can be reduced. However, so long as the necessary purity or the like for the reception signal can be maintained, the circuits may be changed to dynamic circuits.

The frequency converter circuit specifically includes an input side SW 82, an output side SW 84, and a frequency conversion route 88 and a bypass route 86 provided between the SWs, or the like. On the frequency conversion route 88, a mixer 90 and a BPF 92 are provided. These circuits are static circuits. In the Mixer 90, the local signal 68B from the oscillator is mixed with the analog RF reception signal which is input, and, consequently, an intermediate frequency signal is generated. In reality, unnecessary frequency components generated in the mixing process are removed by the BPF 92, and an intermediate frequency signal 93 is thus generated. The BPF 92 has a function, in addition to removing the unnecessary signal components generated by the mixing process (for example, mixer image corresponding to a sum frequency or a difference frequency), as an anti-aliasing filter that suppresses the unnecessary signal in relation to under-sampling to be described later. In the present embodiment, a target signal (for example, 125 MHz) serving as the intermediate frequency signal appears in a third Nyquist zone (for example, 100-150 MHz with respect to 100 MHz sampling). On the frequency axis, the signal components (noise) existing in ranges other than the third Nyquist zone are removed by the BPF 92. After the under-sampling, a second-order aliased or folded signal component (a mirror component of the target signal and a non-inverted component) which appears in a first Nyquist zone (0-50 MHz) is observed.

As described above, in the present embodiment, when the frequency of the observation nucleus falls within the low frequency band, the direct generation scheme; that is, the non-conversion scheme, is selected, and in this case, the input side SW 82 and the output side SW 84 select the bypass route 86. In other words, in this case, the mixer 90 and the BPF 92 do not function. In this case, the output signal of the frequency converter circuit is not the intermediate frequency signal, and is in fact the RF reception signal.

On the other hand, when the frequency of the observation nucleus falls within the high frequency band, the frequency conversion scheme is selected, and in this case, the input side SW 82 and the output side SW 84 select the frequency conversion route 88. In this case, the mixer 90 and the BPF 92 function. In the mixer 90, the RF reception signal is mixed with the local signal 68B, and the mixed signal passes through the BPF 92 and becomes the intermediate frequency signal 93. The transmission side frequency converter circuit and the reception side frequency converter circuit operate in a cooperating manner. In other words, the frequency converter circuits select the same scheme. Alternatively, a configuration may be considered in which separate schemes are selected in the frequency converter circuits. Alternatively, the frequency converter circuit may be provided only on one of the transmission side and the reception side. In the present embodiment, the scheme is selected according to the frequency of the observation nucleus, but alternatively, the scheme may be selected by the user or selected automatically according to other conditions.

With the selection of the bypass route; that is, in the non-conversion scheme, an advantage can be obtained in that the purity of the transmission signal and the reception signal (in particular, the reception signal) can be maintained. Specifically, when a signal passes through a circuit, the signal is inevitably affected by the characteristic or the like of the circuit. With such a structure, a problem may be caused in which the signal component is changed or other components are mixed. The mixer or the like may cause such a problem. In particular, maintaining the purity is important for the reception signal, and, especially, at a low frequency in which the sensitivity and precision of the NMR signal becomes problematic, maintenance of the purity is important. According to the present embodiment, when the RF frequency is low, the non-conversion scheme is selected, and the mixer or the like is bypassed at the transmission side and the reception side. Thus, an advantage can be obtained in that it becomes possible to avoid a problem that unnecessary signals or noise are mixed to the transmission signal and the reception signal due to the mixing or the signal process or the like of the high-frequency signal.

The signal processor circuit 94 includes circuits such as a fixed amplifier, a variable ATT, an LPF, a variable amplifier, or the like. These circuits are static circuits. So long as the quality of the reception signal can be maintained, dynamic circuits may alternatively be employed.

An ADC (A/D converter) 96 is a circuit which converts an analog reception signal 95 which is input (RF reception signal or intermediate frequency signal) into a digital reception signal 97. A sampling frequency of the ADC 96 is, for example, 100 MHz in the present embodiment. In the present embodiment, when the frequency of the observation nucleus falls within a low frequency band of greater than or equal to 5 MHz and less than 50 MHz, the sampling scheme of the ADC 96 becomes over-sampling. In other words, according to Nyquist's theorem, the sampling becomes a sampling with respect to a signal having a frequency of less than ½ of 100 MHz (50 MHz).

On the other hand, when the frequency of the observation nucleus falls within a high frequency band of greater than or equal to 50 MHz and less than or equal to 1000 MHz, the sampling scheme of the ADC 96 becomes under-sampling. That is, with the action of the mixer 90, the frequency of the RF reception signal is fixedly converted to the intermediate frequency of 125 MHz. The intermediate frequency signal is sampled at 100 MHz. Assuming this process, an aliased signal component which is folded from the third Nyquist zone through the second Nyquist zone to the first Nyquist zone (second-order folded signal component) is set as the observation target. In this case also, because the unnecessary noise is reduced in advance with the action of the BPF 92 described above, reduction in SN ratio is prevented. In the first Nyquist zone, a spectrum appears similar to that of the third Nyquist zone. Therefore, by observing the signal existing in the third Nyquist zone via the first Nyquist zone, a spectrum inversion process or the like becomes unnecessary, and an advantage can be obtained that the signal analysis can be easily executed.

In the present embodiment, the intermediate frequency is 125 MHz, and, in principle, for the sampling, a sampling frequency of greater than or equal to 250 MHz, desirably, greater than or equal to 300 MHz, for example, is necessary (in this case, the sampling becomes over-sampling). An ADC which can execute such a high-speed sampling, and in particular, which has a high data resolution (for example, greater than or equal to 16 bits and greater than or equal to 200 Msps) is relatively expensive, and in many cases, it is difficult to obtain or use such an ADC. According to the present embodiment, the under-sampling scheme may be applied for the intermediate frequency signal, and, in addition, the BPF is effectively utilized. Thus, a superior measurement precision can be achieved while using an ADC which is relatively inexpensive and which has a superior resolution.

The quadrature detection circuit is provided downstream of the ADC 96, and includes two mixers 98 and 100 provided in parallel to each other. The mixers 98 and 100 multiply a pair of reference signals 99 generated by a reference signal generator circuit 102; more specifically, a cos signal 99A and a sin signal 99B, by the digital reception signal 97. With this process, the reception signal is converted into a complex signal 101 of an audio frequency band. The complex signal 101 is made of a real part signal 101A and an imaginary part signal 101B.

The reference signal generator circuit 102 in the present embodiment has two reception NCOs that generate a pair of reference signals. The reception NCOs have the same structure as each other. Further, as the reception NCO, apparatuses similar to the transmission NCO for generating the transmission signal are used. Thus, the reception NCO has an arbitrary frequency generation function, a frequency modulation function, and a phase modulation function. When the reception signal to be processed is an intermediate frequency signal, a pair of reference signals having a certain frequency (for example, 25 MHz) for converting the intermediate frequency signal into a baseband signal are generated. When the reception signal is an RF reception signal, a pair of reference signals having a frequency (for example, less than 50 MHz as described above) for converting the RF reception signal into a baseband signal are generated.

In the present embodiment, operations of the two reception NCOs are controlled by a reception sequencer. Therefore, it is possible to dynamically change the parameter supplied to each of the reception NCOs during the measurement, to dynamically switch the phase modulation condition and the frequency modulation condition. Alternatively, the frequency of the reference signal may be dynamically changed. As described, in the present embodiment, a highly-functional quadrature detection circuit is realized. With such a configuration, a high-degree measurement satisfying various needs, and a signal process having a high degree of freedom can be realized.

Two digital filter circuits 104 and 106 are provided downstream of the quadrature detection circuit. These circuits are static circuits, and have a function to remove unnecessary signal components generated by the mixing process and a function to reduce a number of data points before the FFT calculation to convert the sampling rate (decimation). Each of the digital filter circuits 104 and 106 is formed by, for example, a CIC decimation circuit. Reception signals 108 after a predetermined process is applied; that is, a real part signal 108A and an imaginary part signal 108B, are stored in the reception data memory as reception data. Later, processes such as the frequency analysis are executed for reception data which are read from the reception data memory.

The sequencers 26 and 28, the transmission signal generator 30, and the reception signal processor 34 shown in FIG. 1 can be realized by a device such as an FPGA.

Figure 4:
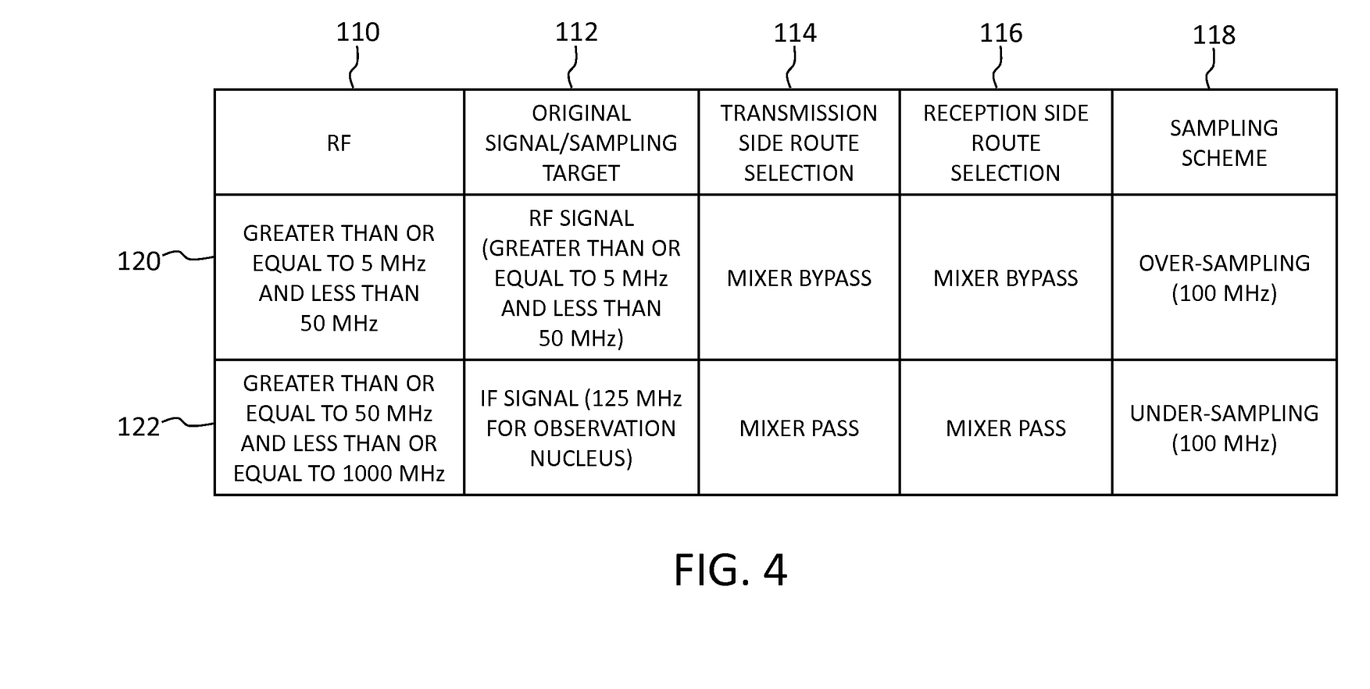
FIG. 4 is a diagram for explaining change of an operation condition according to a frequency of an observation nucleus.

(4) Adaptive Selection of Operation Condition According to Frequency of Observation Nucleus FIG. 4 summarizes two operation conditions selected according to the frequency of the observation nucleus. Reference numeral 110 shows a frequency (RF) of the observation nucleus, reference numeral 112 shows a transmission signal (original signal) and a reception signal as a target of sampling, reference numeral 114 shows the content of a route selection at the transmission side, reference numeral 116 shows the content of a route selection at the reception side, and reference numeral 118 shows a sampling scheme. Reference numeral 120 shows a case where the frequency of the observation nucleus is greater than or equal to 5 MHz and less than 50 MHz; that is, a case where the frequency falls within the low frequency band, and reference numeral 122 shows a case where the frequency of the observation nucleus is greater than or equal to 50 MHz and less than or equal to 1000 MHz; that is, a case where the frequency falls within the high frequency band.

As shown in FIG. 4, when the frequency of the observation nucleus falls within the low frequency band (refer to reference numeral 120), the direct generation scheme (non-conversion scheme) is applied. More specifically, the generated transmission signal is an RF transmission signal rather than an intermediate frequency signal, the bypass route is selected at the transmission side, and the bypass route is selected also at the reception side. Further, the sampling scheme is over-sampling. In this case, the signal to be sampled is the RF reception signal.

On the other hand, when the frequency of the observation nucleus falls within the high frequency band (refer to reference numeral 122), the frequency conversion scheme is applied. More specifically, the generated transmission signal is an intermediate frequency signal rather than an RF transmission signal, the frequency conversion route is selected at the transmission side, and the frequency conversion route is selected also at the reception side. Further, the sampling scheme is under-sampling. The signal to be sampled is the intermediate frequency signal (IF signal).

Alternatively, the lower limit of the low frequency band may be set to a frequency lower than 5 MHz (for example, 1 MHz) or a frequency greater than 5 MHz (for example, 10 MHz). Similarly, the upper limit of the high frequency band may be set to a frequency higher than 1000 MHz (for example, 1500 MHz) or a frequency lower than 1000 MHz (for example, 500 MHz). In the above-described example configuration, a boundary frequency for dividing the two frequency bands is 50 MHz, but the boundary frequency may alternatively be set to a lower frequency. A suitable boundary frequency is desirably determined based on the sampling frequency. Alternatively, a configuration may be employed in which parts of the two frequency bands overlap, and the operation condition can be selected for the overlapped parts. Alternatively, a frequency band which cannot be selected may exist between the two frequency bands.

(5) Detailed Description of Dynamic Variable ATT

Figure 5:
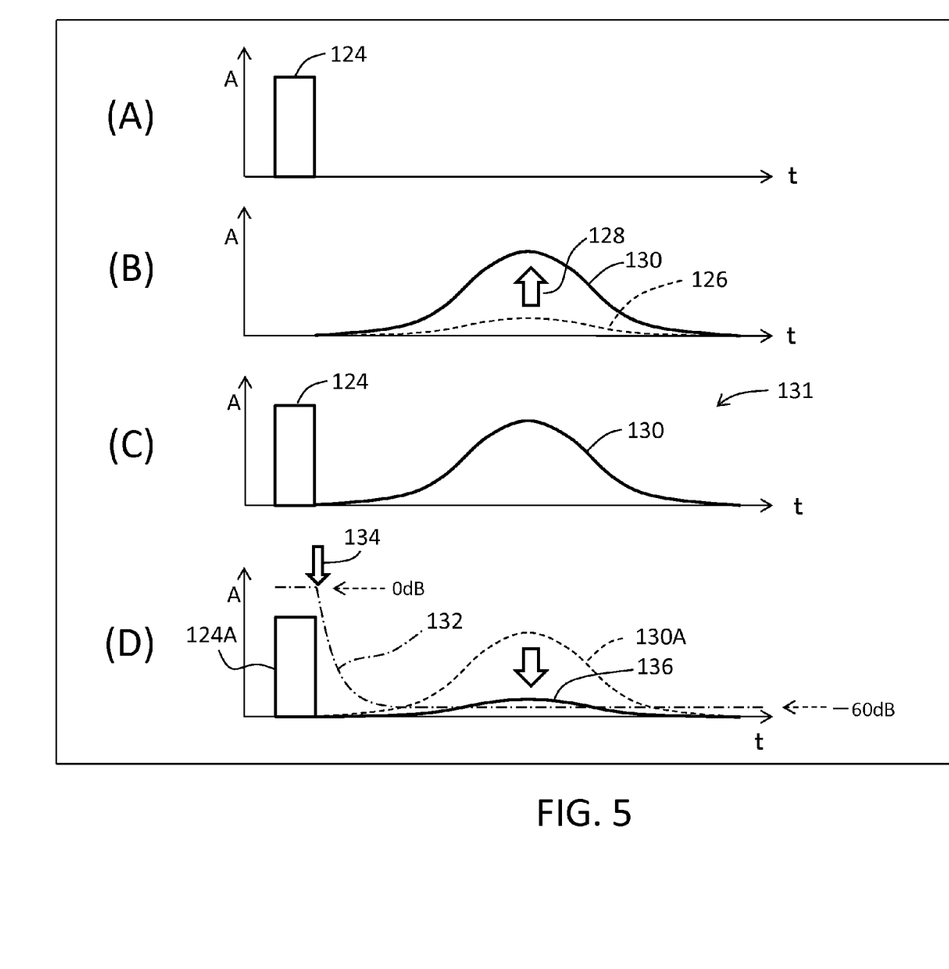
FIG. 5 is a diagram showing a first example operation of a dynamic variable attenuator.

FIG. 5 shows a first example operation of the dynamic variable ATT (attenuator) which is a dynamic circuit. In each graph, a horizontal axis t represents a time axis and a vertical axis A represents an amplitude axis. This is similarly true for other drawings. The graph (A) shows a first transmission signal before synthesis (say, in signal generator 44), which includes a first original pulse 124. The graph (B) shows a second transmission signal before synthesis, which includes a second original pulse 130. The first original pulse 124 is a rectangular pulse, and the second original pulse 130 is a mountain-shaped pulse in which the amplitude changes gradually. In the example shown in the drawings, if the final desired amplitude ratio is to be realized at the time of generation of the signal, a second original pulse 126 must be generated with a very small amplitude compared to the first original pulse 124. Because the amplitude of the second original pulse 126 would be very small and would be represented by a small number of bits, the waveform assumes a step shape (a state where the amplitude resolution is coarse). With such a signal, the output resolution of the DAC cannot be fully utilized. In consideration of this, in the present embodiment, as shown by reference numeral 128, the second original pulse 130 having the amplitude increased is generated.

The graph (C) shows a digital combined signal 131, which includes the first original pulse 124 and the second original pulse 130 but with an incorrect amplitude ratio. The graph (D) expresses an action of the dynamic variable ATT on an analog combined signal generated by D/A conversion of the digital combined signal 131. Immediately after a first pulse 124A corresponding to the first original pulse; that is, at a timing 134, the suppression level of the dynamic variable ATT is changed. A suppression characteristic 132 exemplifies a change with respect to time of the suppression level. Slightly after the timing 134, a large suppression level (−60 dB) is set. As a result, a second pulse 130A (pulse corresponding to the second original pulse 130) which is a mountain-shaped pulse with a large amplitude is suppressed and a second pulse 136 is generated as a mountain-shaped pulse having a desired low amplitude. An amplitude and a waveform of the first pulse 124A which is a rectangular pulse are maintained.

As described, with the dynamic variable ATT, it is possible to suppress the amplitude of only the second pulse 130A while preserving the first pulse 124A. That is, it is possible to generate a pulse train having a desired (correct) amplitude at a later time. In other words, it becomes possible to generate an individual transmission channel signal with an amplitude ratio close to 1 in place of a final amplitude ratio at the stage of the transmission signal, and, thus, the output resolution of the DAC can be effectively utilized.

Even if insufficiency in the suppression is caused in a part of the second pulse 136 (the base portion at the front side) due to a slight delay in the suppression characteristic, the suppression insufficiency part is very small in view of the overall second pulse 136, and does not cause a problem in the signal process. If this becomes problematic, the amplitude may be adjusted at the stage of generation of the transmission signal, or such a configuration may be employed in combination with the dynamic variable ATT.

Figure 6:
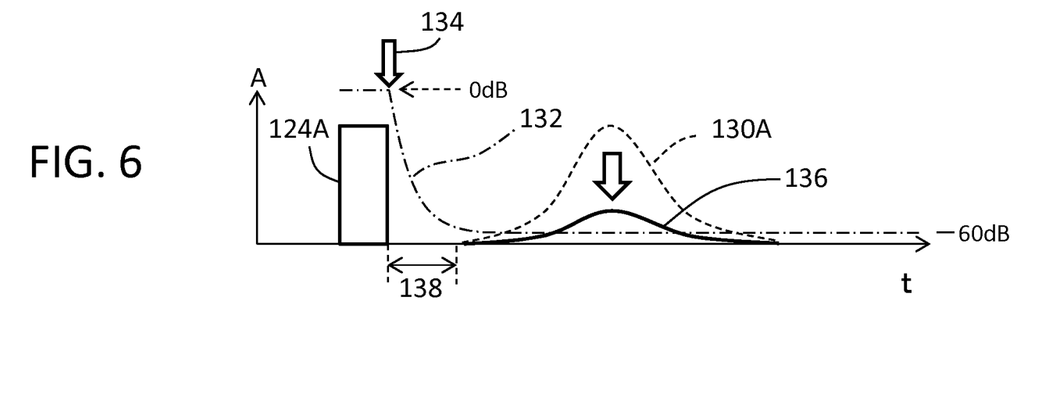
FIG. 6 is a diagram showing a second example operation of the dynamic variable attenuator.

FIG. 6 shows a second example operation of the dynamic variable ATT. The content shown in FIG. 6 occurs more frequently than that shown in FIG. 5. After the first pulse 124A, with a certain time interval 138, the second pulse 130A exists. If the suppression level is increased (specifically, if the suppression level is changed from 0 dB to −60 dB) at a timing 134 immediately after the first pulse 124A for such a pulse train, a suppression characteristic 132 is obtained. In the period of the time interval 138, the suppression characteristic 132 is sufficiently stabilized. In other words, a stable suppression level is caused before the leading part of the second pulse 130A is reached. With such a configuration, the amplitude of the second pulse 130A is suppressed and the second pulse 136 is generated.

Figure 7:
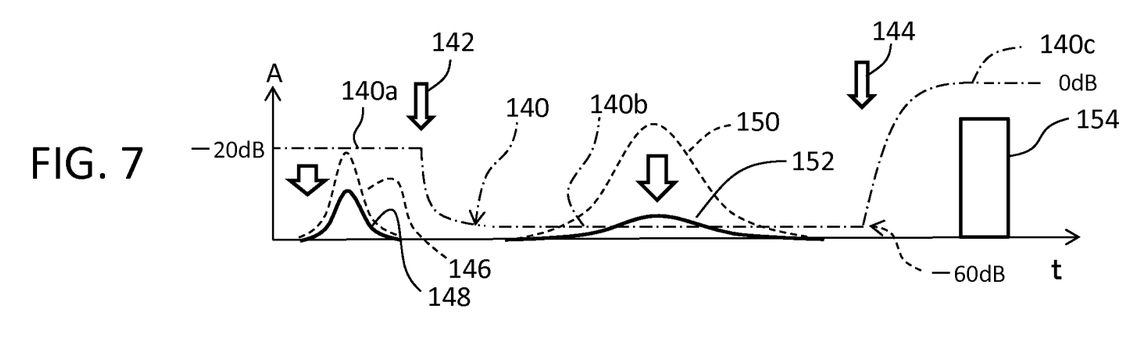
FIG. 7 is a diagram showing a third example operation of the dynamic variable attenuator.

FIG. 7 shows a third example operation of the dynamic variable ATT. In a state before the suppression, a first pulse 146, a second pulse 150, and a third pulse 154 exist in this order in time. For such a pulse train, the suppression level is changed as shown in the drawings at a timing 142 immediately after the first pulse 146, and the suppression level is again changed as shown in the drawings at a timing 144 immediately after the second pulse (immediately before the third pulse). Thus, an attenuation characteristic 140 has three stabilized sections; that is, sections 140a, 140b, and 140c. In the section 140a, the first pulse 146 is suppressed (for example, suppressed to −20 dB), to generate a first pulse 148 having a medium amplitude. In the section 140b, the second pulse 150 is further suppressed (for example, suppressed to −60 dB), to generate a second pulse 152 of a low amplitude. In the section 140c, the third pulse 154 of a large amplitude is not suppressed (that is, 0 dB is set), and the amplitude is maintained. In this manner, according to the pulse train, the suppression level can be dynamically varied at a suitable timing between pulses, to generate a pulse train having a desired amplitude at a later time. In the example shown in the drawings, the suppression level is dynamically changed in units of the pulses, but alternatively, the suppression level may be changed during a pulse period, to manipulate the waveform shape. However, when the suppression operation becomes unstable due to the change of the suppression level, it is desirable to change the suppression level between the pulses.

Figure 8:
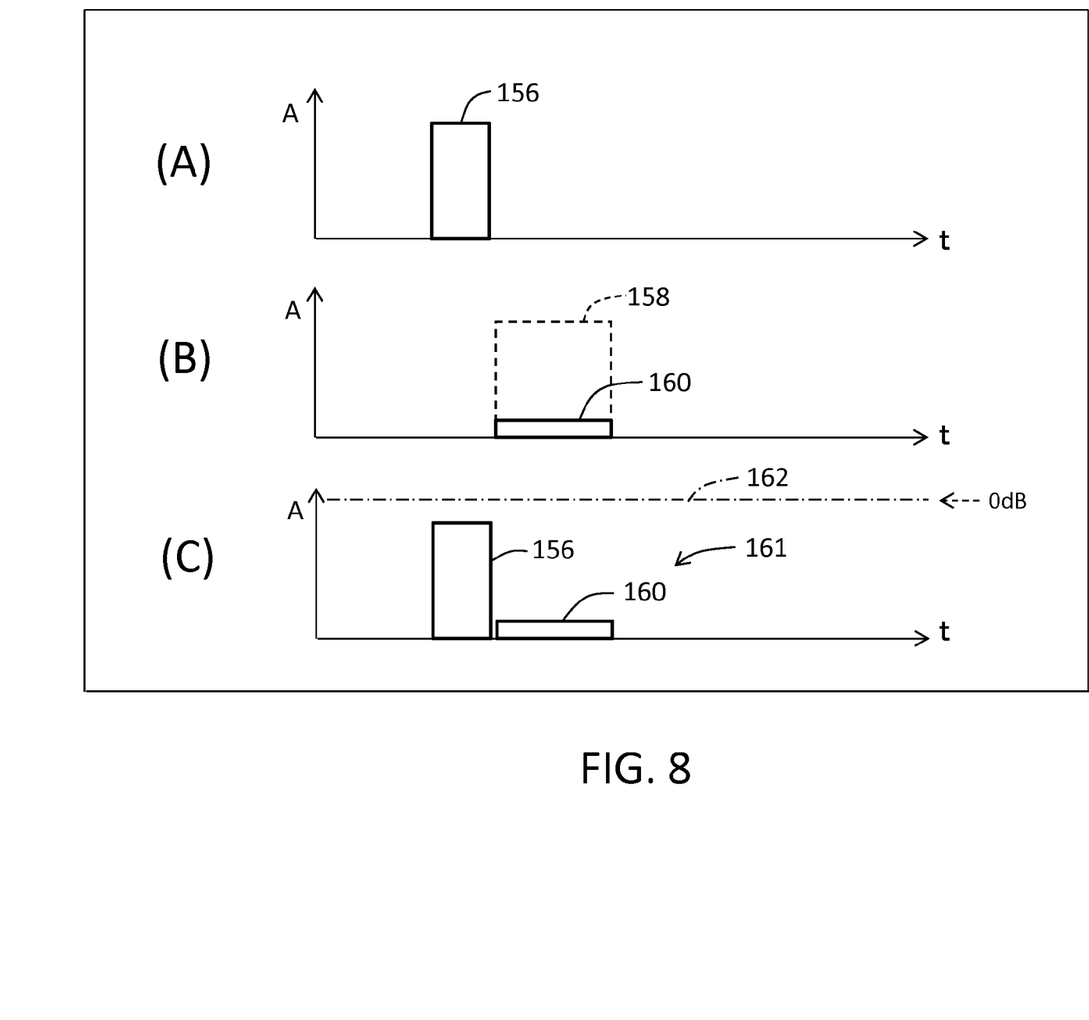
FIG. 8 is a diagram showing a fourth example operation of the dynamic variable attenuator.

FIG. 8 shows a fourth example operation of the dynamic variable ATT. The graph (A) shows a first transmission signal, which includes a first original pulse 156. The graph (B) shows a second transmission signal, which includes a second original pulse 160. The first original pulse 156 and the second original pulse 160 are both rectangular pulses. Therefore, in the second original pulse 160, a low amplitude is set from the stage of the generation say, in signal generator 44. Thus, a second original pulse 158 having a large amplitude is not generated. The graph (C) shows a combined signal 161 and a suppression characteristic 162. In this example operation, the suppression by the dynamic variable ATT (dynamic variation of the suppression level) is not executed. In other words, after passing through the dynamic variable ATT, the first pulse 156 and the second pulse 160 have their amplitudes maintained, and their waveforms maintained.

As described, it is desirable to select the original amplitude suppression and the afterwards amplitude suppression according to the circumstances, or to combine these schemes for use.

Figure 9:
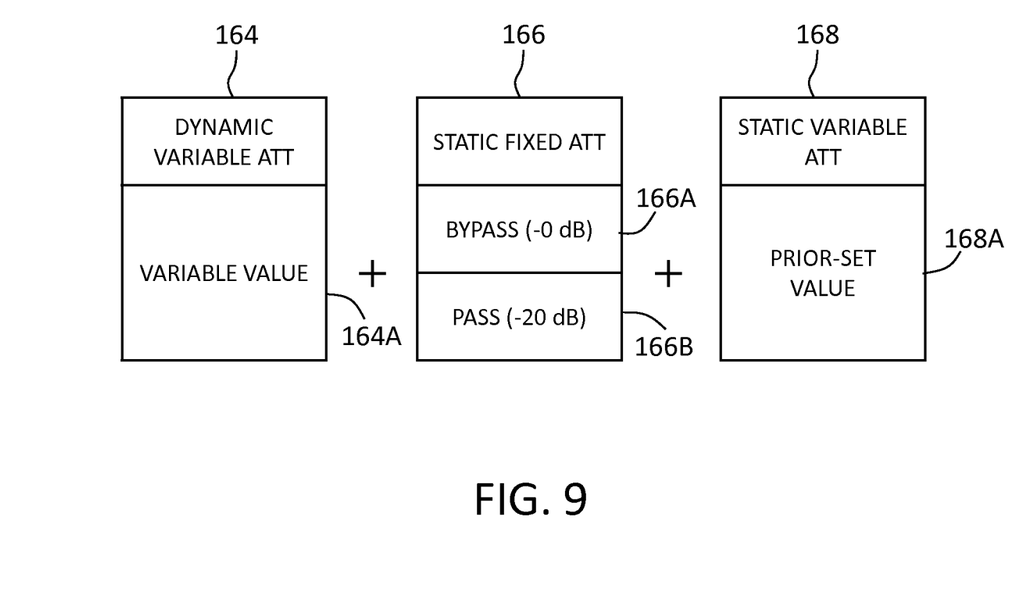
FIG. 9 is a diagram for explaining a combination of a plurality of attenuators.

FIG. 9 summarizes a combination of the dynamic variable ATT and other ATTs. In the present embodiment, in addition to the dynamic variable ATT (refer to reference numeral 164), a static fixed ATT (refer to reference numeral 166), and a static variable ATT (refer to reference numeral 168) are provided. The signal processor circuit 70 shown in FIG. 2 has the static fixed ATT and the static variable ATT. A desired amplitude can be realized by suitably combining the three types of ATTs. In the dynamic variable ATT, as shown by reference numeral 164A, the variable value (variable suppression value) is dynamically set. In the static fixed ATT, as shown by reference numerals 166A and 166B, whether or not the ATT is to be used (that is, passing through or bypassing the ATT of 20 dB) can be switched. Further, in the static variable ATT, the suppression is executed by a prior-set value which is statically set (variable suppression value).

When suppression (gain adjustment) is to be executed for the entirety of the pulse train, the static fixed ATT and the static variable ATT are used. When the suppression is to be further executed for a part of the pulse train, the dynamic variable ATT is used. In this manner, an optimum combination can be selected according to the situation. For example, when it is not necessary to dynamically execute the suppression of the pulse train, it is desirable to apply the static suppression downstream of the transmission signal generator. During a process where the RF transmission single which is an analog signal passes through the transmission signal generator circuit, unnecessary signals (noise or the like) may be mixed in each circuit. If the RF transmission signal is suppressed upstream of the process, the intensity difference between the RF transmission signal and the unnecessary signal would be reduced, and the unnecessary signal may become non-ignorable. On the other hand, if the RF transmission signal is suppressed downstream of the process, ideally, at the final output stage, the unnecessary signals would be suppressed together with the RF transmission signal, and the degradation of the intensity difference between the RF transmission signal and the unnecessary signals can be avoided. It is desirable to selectively operate the three types of ATTs or to select an optimum combination thereof in consideration of such circumstances and the necessity for the afterwards pulse suppression, or the like.

The invention claimed is:

1. A magnetic resonance measurement apparatus having a dynamic variable attenuator comprises:
   a plurality of signal generators that generate a plurality of transmission signals as a plurality of digital signals;
   a combiner that combines the plurality of transmission signals to generate a digital combined signal;
   a digital-to-analog converter that converts the digital combined signal into an analog combined signal;
   a dynamic variable attenuator that suppresses the analog combined signal and in which a suppression level can be varied during measurement; and
   a controller that controls operations of the plurality of signal generators and the dynamic variable attenuator.

2. The magnetic resonance measurement apparatus according to claim 1, wherein
   the plurality of digital transmission signals include a first transmission signal and a second transmission signal,
   the analog combined signal includes a first analog pulse based on the first transmission signal and a second analog pulse based on the second transmission signal following after the first analog pulse, and
   the controller changes the operation of the dynamic variable attenuator between analog pulses.

3. The magnetic resonance measurement apparatus according to claim 2, wherein
   the first transmission signal includes a first original digital pulse which is an origin of the first analog pulse,
   the second transmission signal includes a second original digital pulse which is an origin of the second analog pulse, and
   the controller controls the operations of the plurality of signal generators such that a ratio between an amplitude of the first original digital pulse and an amplitude of the second original digital pulse is closer to 1 than is a ratio between an amplitude of the first analog pulse and an amplitude of the second analog pulse.

4. The magnetic resonance measurement apparatus according to claim 3, wherein
   the controller changes the operation of the dynamic variable attenuator between the first analog pulse and the second analog pulse when the first pulse which is a rectangular pulse and the second pulse which is a non-rectangular pulse are consecutive on a time axis.

5. The magnetic resonance measurement apparatus according to claim 3, wherein
   the controller changes the operation of the dynamic variable attenuator between the first analog pulse and the second analog pulse when the first pulse which is a non-rectangular pulse and the second pulse which is a rectangular pulse are consecutive on a time axis.

6. The magnetic resonance measurement apparatus according to claim 1, wherein
   the controller is formed by one or a plurality of sequencers that execute a sequence of instructions generated from a pulse program, and
   the sequence of instructions includes an instruction to change the operation of the dynamic variable attenuator.

7. The magnetic resonance measurement apparatus according to claim 1, further comprising:

a power amplifier provided downstream of the dynamic variable attenuator.

8. The magnetic resonance measurement apparatus according to claim 7, further comprising:
a mixer provided between the dynamic variable attenuator and the power amplifier, and that executes a frequency conversion.

9. The magnetic resonance measurement apparatus according to claim 1, wherein
the dynamic variable attenuator comprises a plurality of attenuation elements, and
the controller selects one or a plurality of attenuation elements to be operated from among the plurality of attenuation elements, to stepwise switch the suppression level.

10. The magnetic resonance measurement apparatus according to claim 1, further comprising:
a transmission signal generator including the plurality of signal generators, the combiner, the digital-to-analog converter, and the dynamic variable attenuator, and that outputs a transmission signal;
a power amplifier that amplifies the transmission signal;
an NMR probe to which a transmission signal which is output from the power amplifier is input and that outputs a reception signal as an NMR signal; and
a reception signal processor that processes the reception signal.

11. The magnetic resonance measurement apparatus according to claim 10, wherein
the transmission signal generator comprises a transmission mixer that executes a frequency conversion for generating the transmission signal,
the reception signal generator comprises a reception mixer that executes a frequency conversion for processing the reception signal, and
the controller changes whether or not to execute the frequency conversions at the transmission signal generator and the reception signal generator according to an observation nucleus.

* * * * *